United States Patent [19]
McKee et al.

[11] Patent Number: 5,004,887
[45] Date of Patent: Apr. 2, 1991

[54] HEATING APPARATUS HAVING CURIE EFFECT HEATER

[75] Inventors: Michael J. McKee, New Cumberland; William D. Miknis; Joseph M. Pawlikowski, both of Lancaster; William E. Zelko, Dauphin, all of Pa.

[73] Assignee: AMP Incorporated, Harrisburg, Pa.

[21] Appl. No.: 384,331

[22] Filed: Jul. 24, 1989

[51] Int. Cl.⁵ .............................................. B23K 1/00
[52] U.S. Cl. .............................. 219/85.16; 219/85.18; 219/505
[58] Field of Search ...................... 219/549, 505, 85.16, 219/85.11, 85.18

[56] References Cited

U.S. PATENT DOCUMENTS

| | | | |
|---|---|---|---|
| 4,081,658 | 3/1978 | Ammann | 219/85.16 |
| 4,220,845 | 9/1980 | Morreale | 219/85.16 |
| 4,256,945 | 3/1981 | Carter et al. | |
| 4,412,123 | 10/1983 | Ammann et al. | 219/85.16 |
| 4,695,713 | 9/1987 | Krumme | |
| 4,788,404 | 11/1988 | Kent | 219/549 |
| 4,795,870 | 1/1989 | Krumme et al. | 219/85.11 |
| 4,795,886 | 1/1989 | Carter, Jr. | 219/505 |

OTHER PUBLICATIONS

Unitek catalog 237, "Pulse Heated Reflow Soldering System for Flat Cable".

*Primary Examiner*—Clifford C. Shaw
*Attorney, Agent, or Firm*—Katherine A. Nelson

[57] ABSTRACT

A heater bar assembly intended for use in a soldering apparatus or the like has a laminated self-regulating Curie effect heater mounted on a rigid support member. The heater is rapidly heated in use up to its Curie temperature and maintained at that temperature during a soldering operation so that overheating does not occur and, on the other hand, cold joints are avoided. The heater is slightly resilient, or deformable, so that when it is brought into contact with the wires, it is deformed by the wires thereby increasing the area of contact with the wires. A complete integrated soldering apparatus incorporating the heater bar assembly is also described.

19 Claims, 8 Drawing Sheets

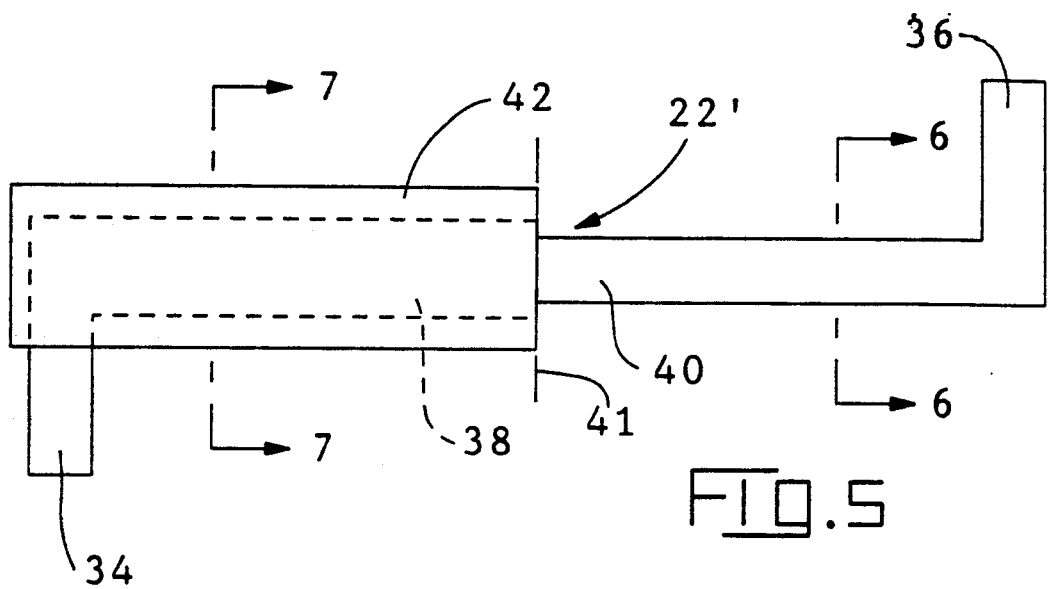
FIG.5
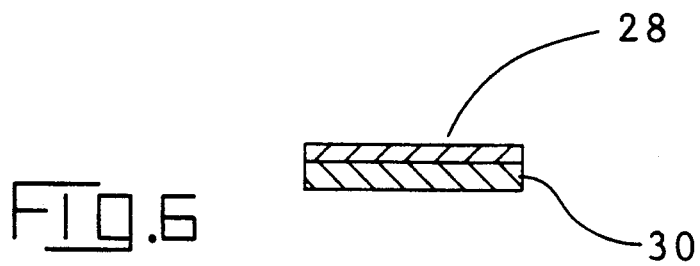
FIG.6
FIG.7
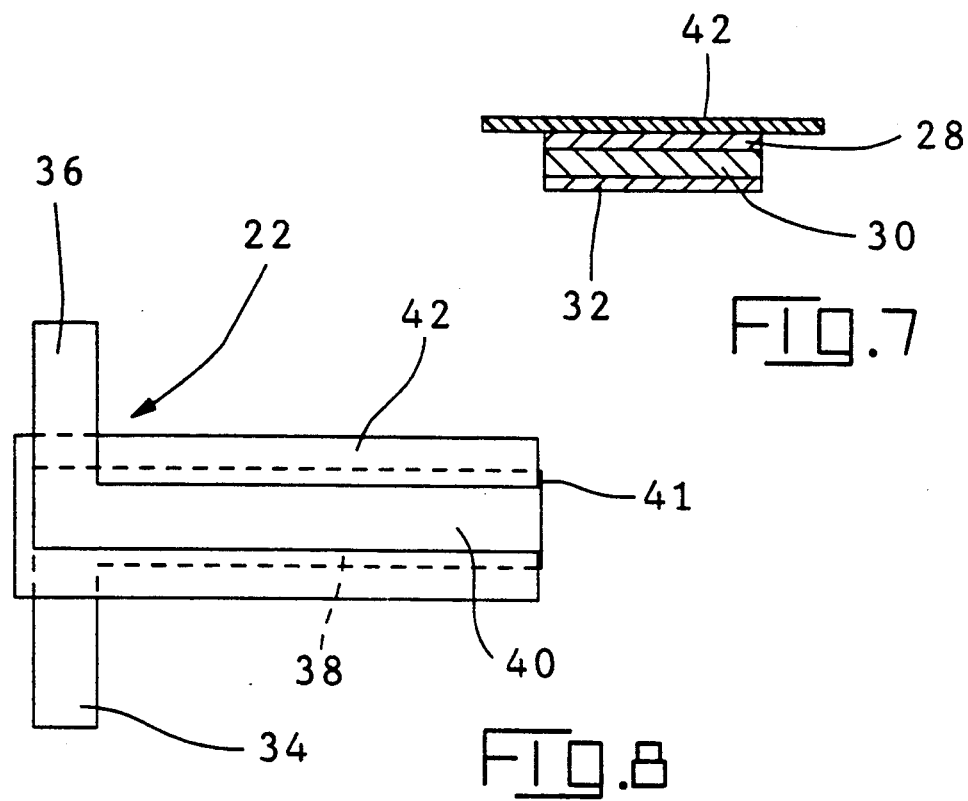
FIG.8

HEATING APPARATUS HAVING CURIE EFFECT HEATER

FIELD OF THE INVENTION

This invention relates to a heating apparatus having a Curie effect heater for delivering heat to a predetermined zone. The invention is herein disclosed in an embodiment comprising a soldering apparatus for soldering spaced-apart parallel conductors to terminal pads on a substrate; however, the invention can be used under a variety of other circumstances.

BACKGROUND OF THE INVENTION

When spaced-apart conductors, such as the conductors in a flat cable, must be soldered to spaced-apart terminal pads on a substrate, such as the terminal pads on a circuit board, it is common practice to carry out the operation by means of an apparatus having a rigid resistance element, commonly referred to as a heater bar, which is heated by passing a current therethrough to cause the bar to be heated by the $I^2R$ heating effect. In the use of apparatus of this type, the conductors are positioned against the terminal pads by means of a suitable fixture or work holder and the bar is brought into engagement with the conductors so that the solder, which was previously applied to either the conductors or the terminal pads, will be melted and will bond the conductors to the pads. While apparatus of this type can be used under many circumstances, problems are sometimes encountered for a number of reasons For example, the heating bar is heated along its entire length and the heating is controlled usually by a single thermostat placed at some location along the bar. If one portion of the bar is cooled, as by an air current, to a greater extent than another portion, the portion which is cooled will be at a lower temperature than the remainder of the bar and soldering of the conductors in contact with the low temperature portion of the bar may not be satisfactorily carried out. Also, the fact that the heater bar must be heated along its entire length sometimes gives rise to a problem of overheating in that heat is required only at the actual sites where the soldering operation is being carried out, that is, where the wires are contacted by the soldering bar, and the portions of the soldering bar between adjacent wires may be heated to a higher temperature than those portions which are in contact with the wires. If the substrate on which the terminal pads are located is incapable of withstanding the heating effect of the intervening portions of the bar, the substrate may be damaged by radiant heat from the heater bar. The fact that the heater bar is a rigid member can also cause problems in that it will be positioned against the conductors and if one or more of the conductors is slightly undersized, good physical contact between the heater bar and the undersized conductor may not be achieved with a resulting reduction in the amount of heat which is transferred to the undersized conductor so that it may not be properly soldered to its associated terminal pad. Finally, it should be mentioned that under ideal conditions, the heater bar contacts the conductors only along a short line or at a point of tangency and heat transfer can take place only at this single point or line. It would be desirable to increase the area of contact of the heater element with the individual conductors thereby to improve the heat transfer capabilities at the interface of the heater and the conductors.

The present invention is directed to the achievement of an improved heater bar assembly and an improved apparatus which overcomes or minimizes the problems discussed above and which presents other advantages as will be discussed below. The improved results achieved in the practice of the present invention result from the use of a bi-metallic self-regulating Curie effect heater which is supported in a heater bar assembly in a particular manner and which is incorporated into the soldering apparatus. The term "bi-metallic self-regulating Curie effect heater" as used herein is intended to refer to a type of heating device described in U.S. Pat. No. 4,256,945 and in U.S. Pat. No. 4,695,713. Heaters of this type are made up of a magnetic material and a non-magnetic material, the magnetic material having a predetermined Curie point. When a high frequency current is passed through the heater, the current is concentrated as a result of the skin effect in the magnetic portion thereof and it is rapidly heated to its Curie temperature at which the magnetic permeability of the material abruptly falls so that the temperature does not rise significantly above the Curie temperature. If heat is extracted from the system, the temperature may drop below the Curie temperature and the magnetic permeability of the magnetic layer will increase to its higher level. The rate at which heat is generated will then increase as a result of the skin effect so that the heater is self-regulating. Reference is made to the above-identified U.S. Patents, which are hereby incorporated by reference, for further details of the construction and operation of Curie-type heaters.

THE INVENTION

One embodiment of the invention comprises a heater bar assembly for delivering heat to a predetermined zone. The heater bar assembly comprises an insulating support member and a bi-metallic self-regulating Curie effect heater. The support member has a supporting edge and two major surfaces extending from the supporting edge. The heater has a non-magnetic layer having a relatively high conductivity and a magnetic layer having a relatively low conductivity. The heater has opposite ends and has heater terminals at the ends. The heater is folded end-to-end, on a fold line which is substantially mid-way between the ends so that the heater terminals are adjacent to each other. The folded heater thus comprises two substantially parallel aligned sections which extend from the heater terminals to the fold. The two sections have their magnetic surfaces opposed to, and proximate to, each other and have their non-magnetic surfaces remote from each other and facing in opposite directions. Insulating material is provided between the opposed magnetic surfaces. The heater is secured to the support member with the supporting edge against the non-magnetic material of one of the folded sections, with the supporting edge extending from the terminals to the fold, and with the non-magnetic material of the other folded section facing away from the support so that upon passage of a high frequency current through the heater, the magnetic material will be heated to, and maintained at, its Curie temperature by skin effect phenomena. The heater has marginal side portions which extend from the heater terminals to the fold and these marginal side portions extend from the supporting edge laterally partially over the major surfaces of the support member. The heater may be secured to the support member by suitable clamps which clamp the marginal side portions of the two aligned sections against the major surfaces of the support.

The insulating support is advantageously a plate-like member with the two major surfaces being parallel and facing in opposite directions. The supporting edge is then an edge surface of the plate-like member which extends between, and normally of, the major surfaces.

When the heater bar assembly is used for soldering, it is advantageous to provide a coating on the non-magnetic material of the folded section which faces away from the support of material which is not wettable by solder such as a stainless steel, which is preferably a non-magnetic stainless steel.

In a preferred embodiment of the invention, a high frequency power supply, a matching impedance network, a power supply transmission line, and a network transmission line are provided in combination with the heater. The matching impedance network serves to match the impedance of the heater to the impedance of the power supply. The matching impedance network is located adjacent to, and is part of, the heater bar assembly and the heater terminals comprise flat ears which are integral with, and which extend from, the laminate The network transmission line which extends from the matching impedance network to the heater comprises flat planar network ears which extend from the network to the heater and which are against, and in electrical contact with, the heater ears.

Where the heater bar assembly is intended for use in soldering operations, it is also desirable to have the heater somewhat resiliently deformable towards the supporting edge of the supporting member so that when the heater is moved against a plurality of spaced-apart conductors during the soldering operation, the portion of the heater which engages the conductors will yield or deform slightly and contact each conductor over an arcuate area extending across the top of each conductor thereby to increase the area of contact and to ensure that each conductor is in fact physically contacted by the heater bar.

A heater bar assembly as described above can be used in a soldering apparatus of the type used for soldering the conductors in a flat cable to an array of second conductors such as spaced-apart terminal pads on a substrate. An apparatus of this type comprises a work holder for holding the cable conductors against the terminal pads, the heater bar assembly as described above, and a fixture means for holding the heater and moving the heater against the conductors The substrate on which the terminal pads are located and the cable are held in another work holder or fixture which positions the conductors of the cable against the terminal pads.

In accordance with a further embodiment, the invention is directed to the achievement of an improved method for carrying out the soldering operation for soldering an array of spaced-apart, parallel first conductors to an array of spaced-apart second conductors. The method comprises the steps of locating each of the first conductors in alignment with and adjacent to one of the second conductors and thereafter positioning an elongated self-regulating Curie effect heater against the first conductors so that upon energizing the heater, the first conductors will be heated selectively to the Curie temperature of the heater. A suitable soldering alloy having a melting point which is lower than the Curie temperature is used for the soldering operation.

THE DRAWING FIGURES

FIG. 5 is a plan view showing the blank for the heating unit of a heater assembly.

FIGS. 6 and 7 are views looking in the direction of the arrows 6—6 and 7—7 of FIG. 5.

FIG. 8 is a plan view of the blank after folding and prior to assembly of the folded heating unit to a support member.

Figure 9:
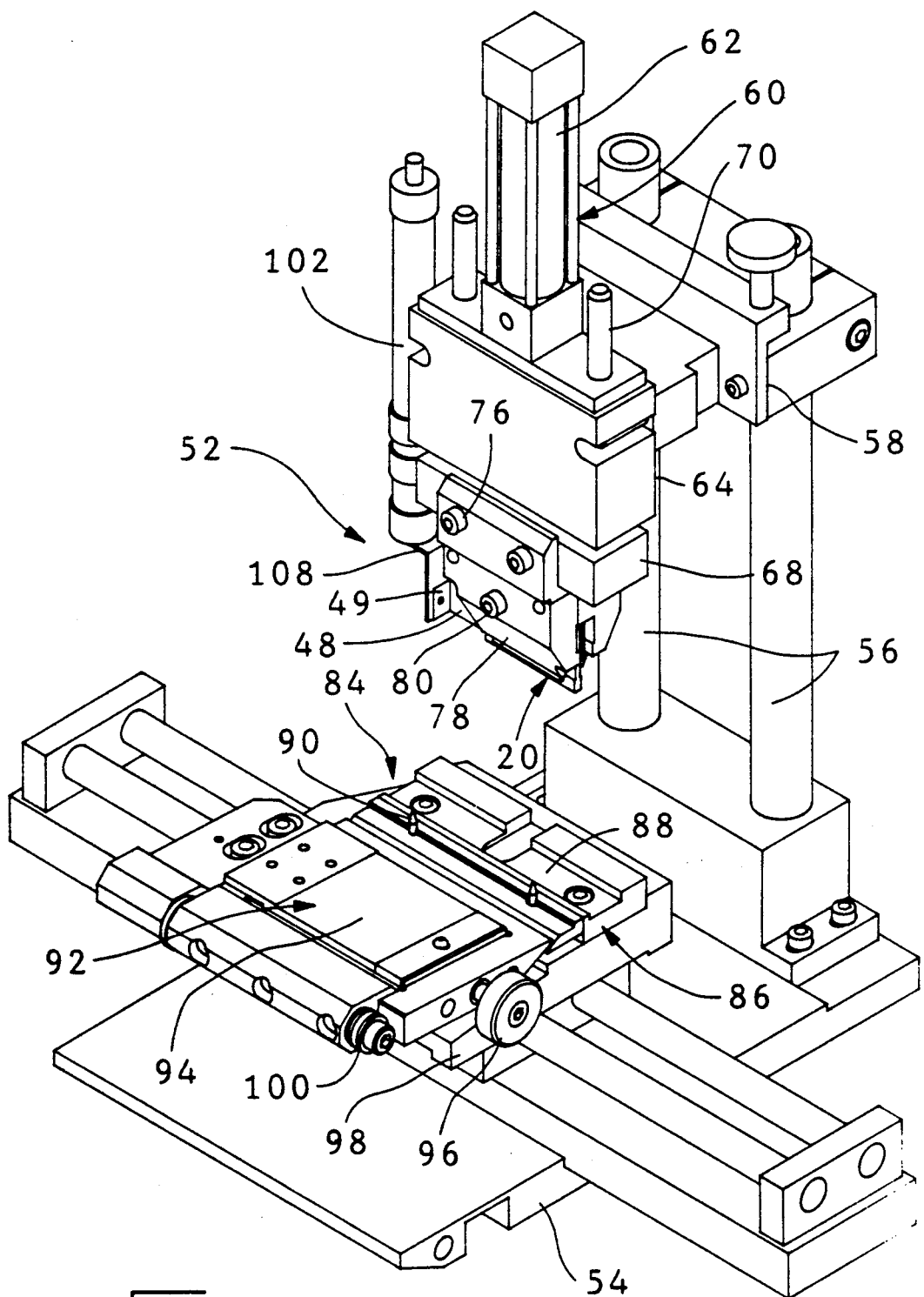

FIG. 9 is a perspective view of a soldering apparatus which incorporates a heater assembly in accordance with the invention.

Figure 10:
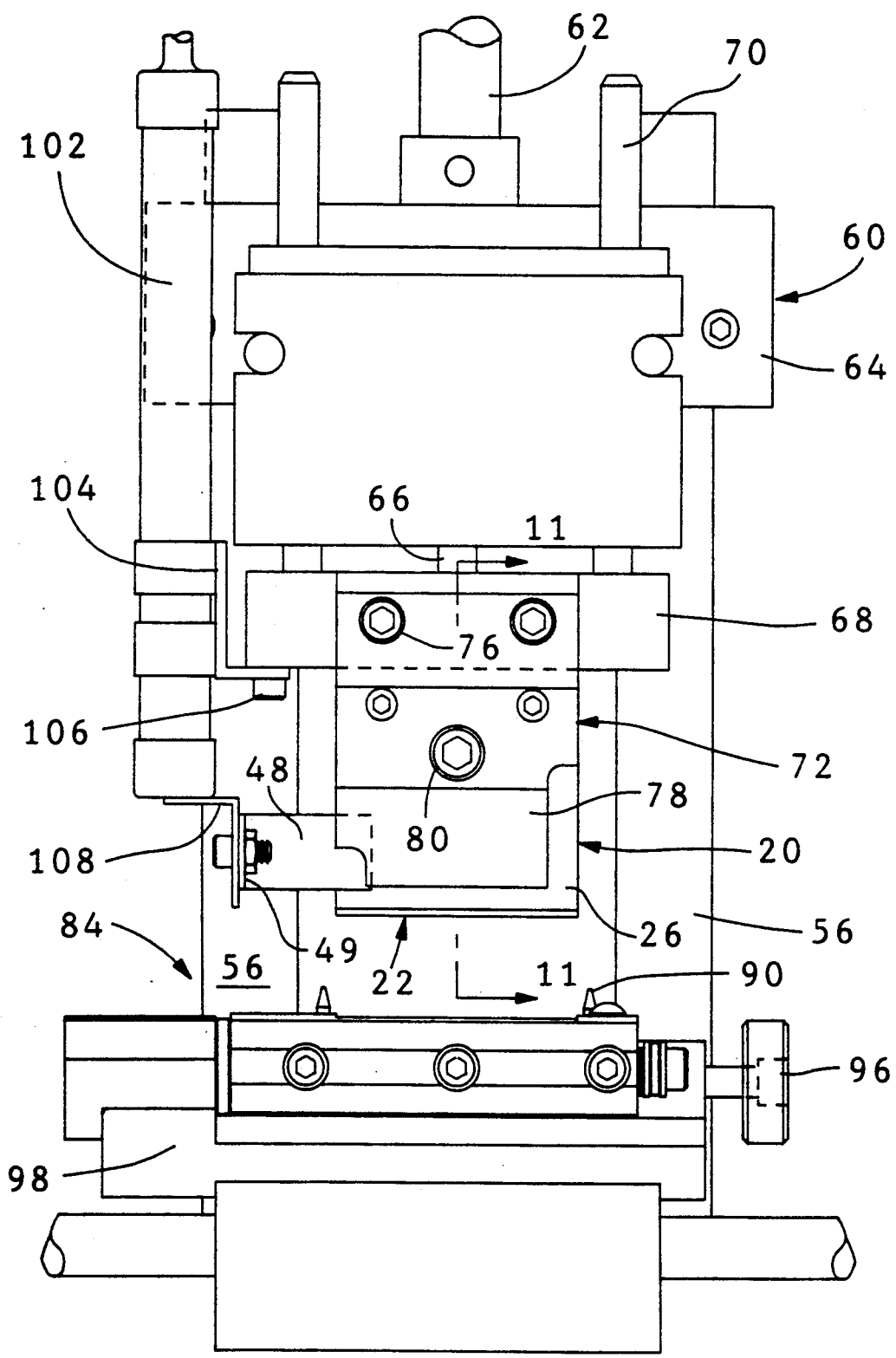

FIG. 10 is a frontal view of the apparatus.

Figure 11:
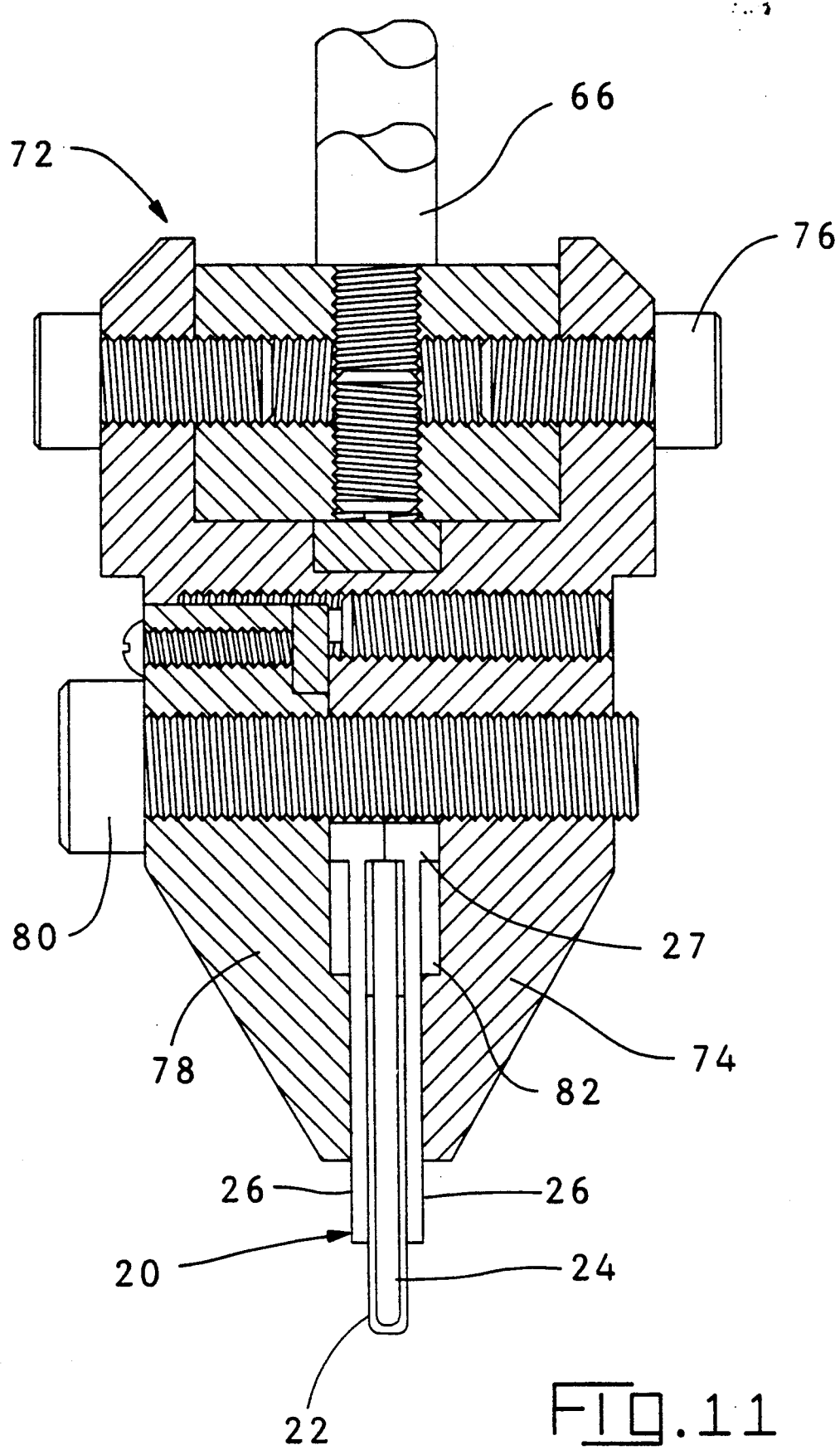

FIG. 11 is a sectional view taken along the lines 11—11 of FIG. 10.

Figure 12:
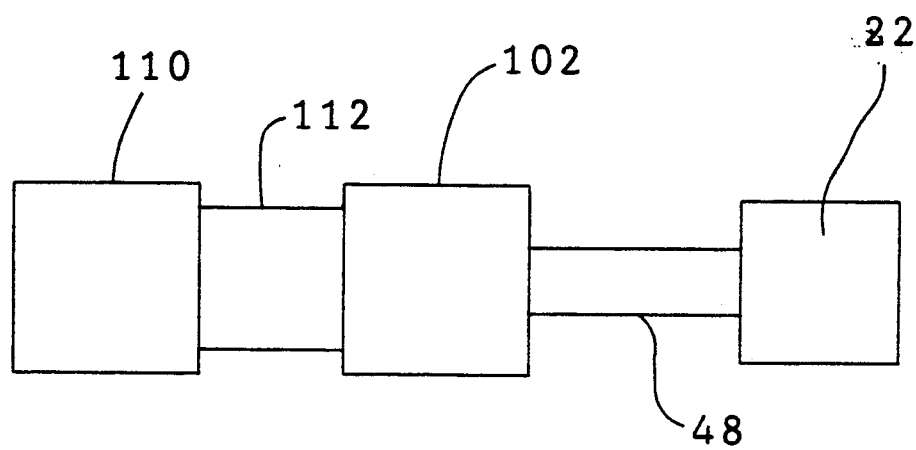

FIG. 12 is a block diagram of the electrical system for the heater.

Figure 13:
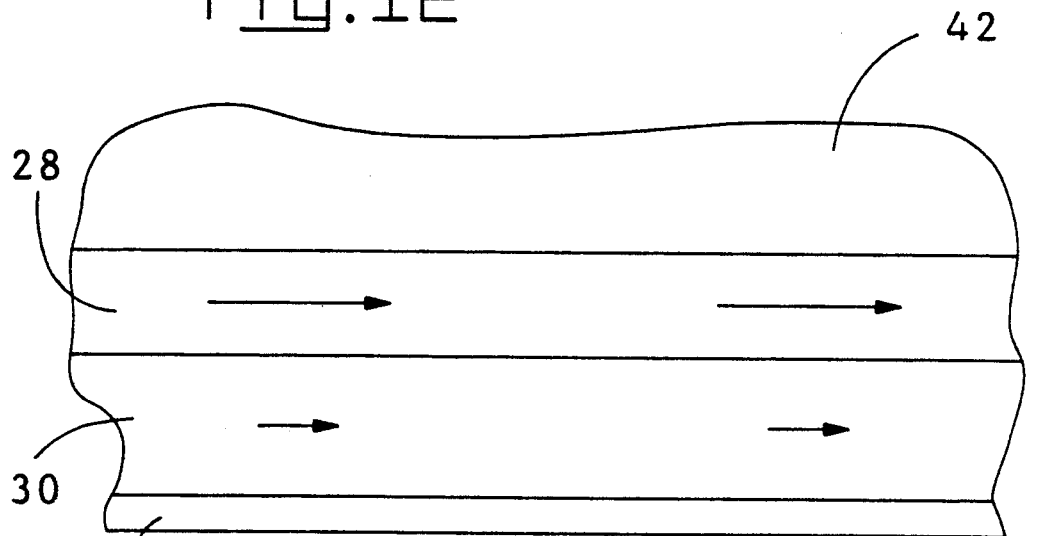
Figure 14:
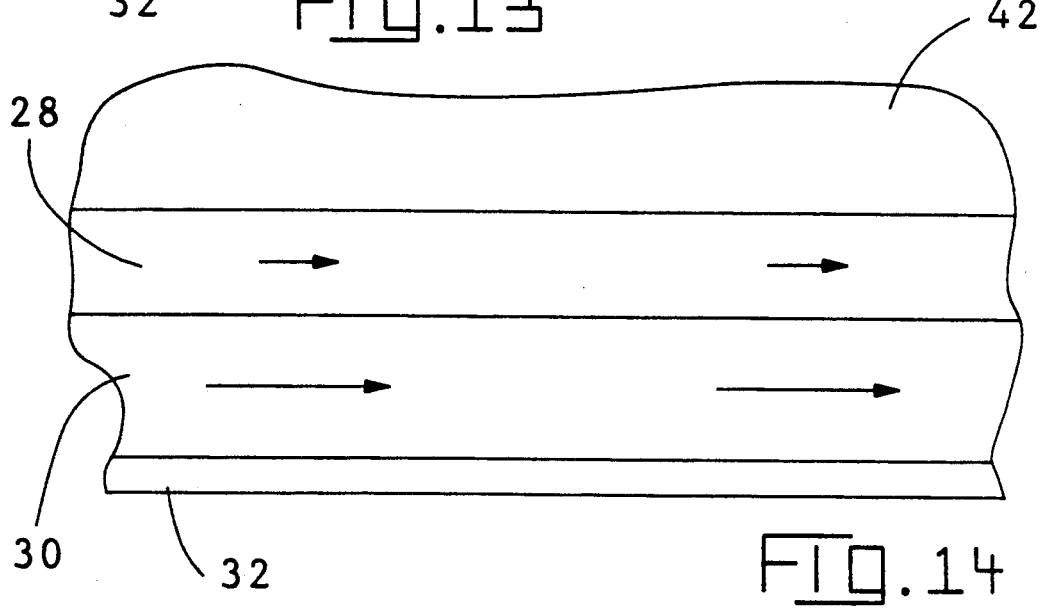

FIGS. 13 and 14 are views which illustrate the flow of current in a Curie effect heater at a temperature below the Curie temperature (FIG. 13) and above the Curie temperature (FIG. 14).

Figure 15:
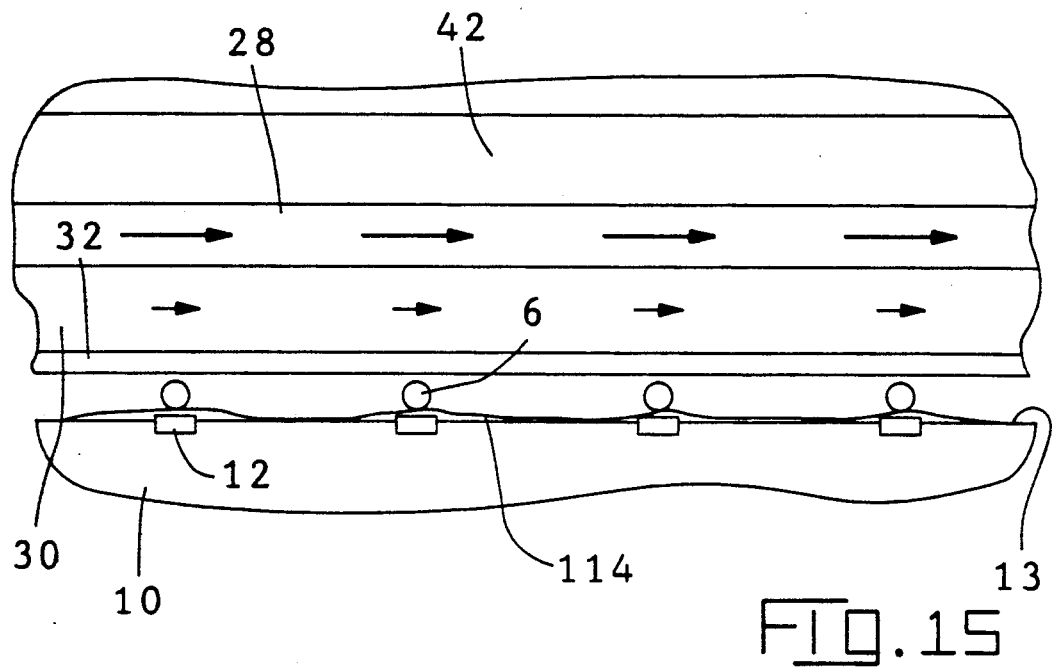
Figure 16:
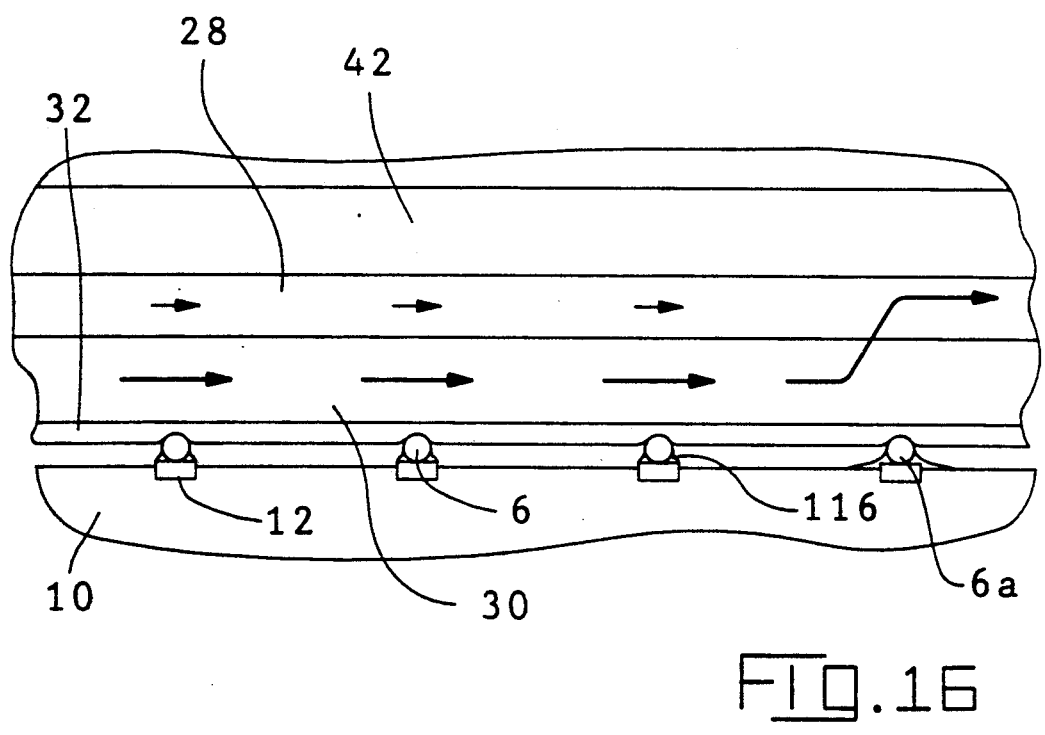

FIGS. 15 and 16 are idealized views which illustrate the operation of the present invention and particularly the manner in which heat is transferred to the conductors in a cable when a soldering operation is carried out.

THE DISCLOSED EMBODIMENT

Figure 1:
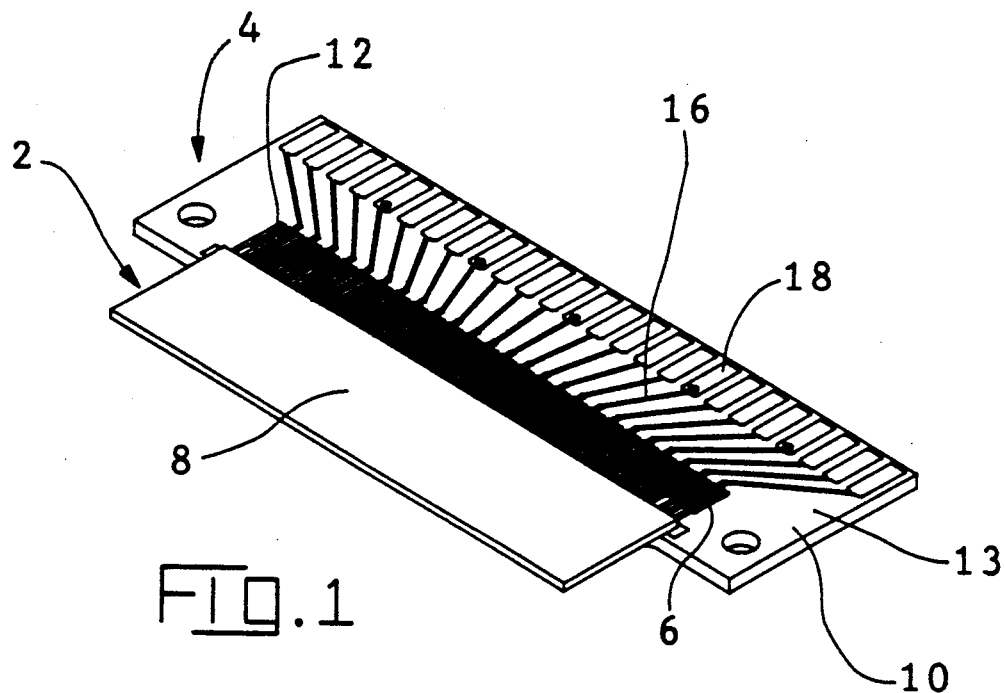
FIG. 1 is a perspective view of a substrate and a section of a flat cable with the conductors of the cable soldered to terminal pads on the substrate.
Figure 2:
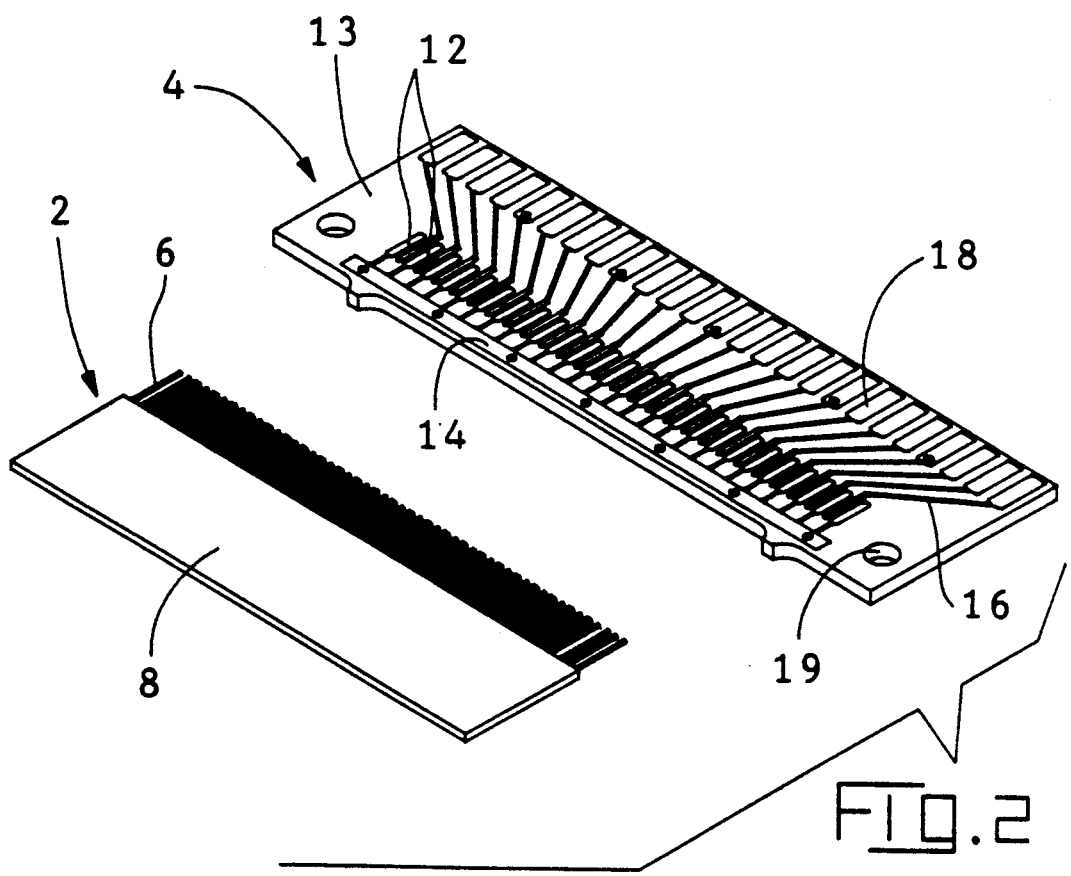
FIG. 2 is a view similar to FIG. 1 showing the cable and substrate prior to soldering.

FIG. 1 shows the end portion of a cable 2 having conductors 6 which are soldered to spaced-apart terminal pads 12 on the upper surface 13 of a substrate in the form of an adapter 4. Every other one of the terminal pads 12 has a conductor extending to a common ground 14 and the remaining terminal pads 12 are connected by substrate conductors 16 to larger terminal pads 18, as best seen in FIG. 2. The adapter 4 is intended to be plugged into a complimentary connecting device (not shown) so that the conductor 6 of the cable 2 will be connected to terminals in the complimentary connecting device.

When the conductors 6 are soldered to the terminal pads 12, the conductors are located in alignment with, and against, the terminal pads and a suitable heater is brought into contact with the conductors so that solder which has been provided on the pads will be fused and the soldering operation completed. The soldering operation is carried out by means of a heater bar assembly which is incorporated in a soldering apparatus described below.

Referring to FIGS. 3–8, the heater assembly 20 comprises a heating unit 22, an insulating support 24, and clamping plates 26. The heating unit 22 is formed from a flat blank 22', FIG. 5, and comprises a magnetic layer 28 of a material such as an iron nickel alloy and a non-magnetic layer 30 of a non-magnetic, highly conductive material, preferably copper. Advantageously, when the heater assembly is used for soldering, a coating 32 is provided on the non-magnetic layer 30 which is not wettable by the solder composition which is to be used.

The coating 32 may be, for example, of a suitable stainless steel which is non-magnetic or of a temperature resistant plastic material. The blank 22', has laterally extending ears 34, 36 at its ends which function as terminals, a relatively wide portion 38 and a relatively narrow portion 40. The wide and narrow portions each extend from their ends to an intermediate fold line 41 which is mid-way between the ears 34, 36.

The blank is produced by cladding the magnetic layer 28 and the non-wettable layer 32 onto the copper; layer 30 that is, by placing the layers on each other and applying heat and pressure so that they are bonded. The non-magnetic layer will typically have a thickness of about 0.002 inches (0.051 mm) and the magnetic layer will typically have a thickness of about 0.0005 inches (0.013 mm). The Kapton separator, referred to below, has a thickness of about 0.001 inches (0.025 mm).

Figure 3:
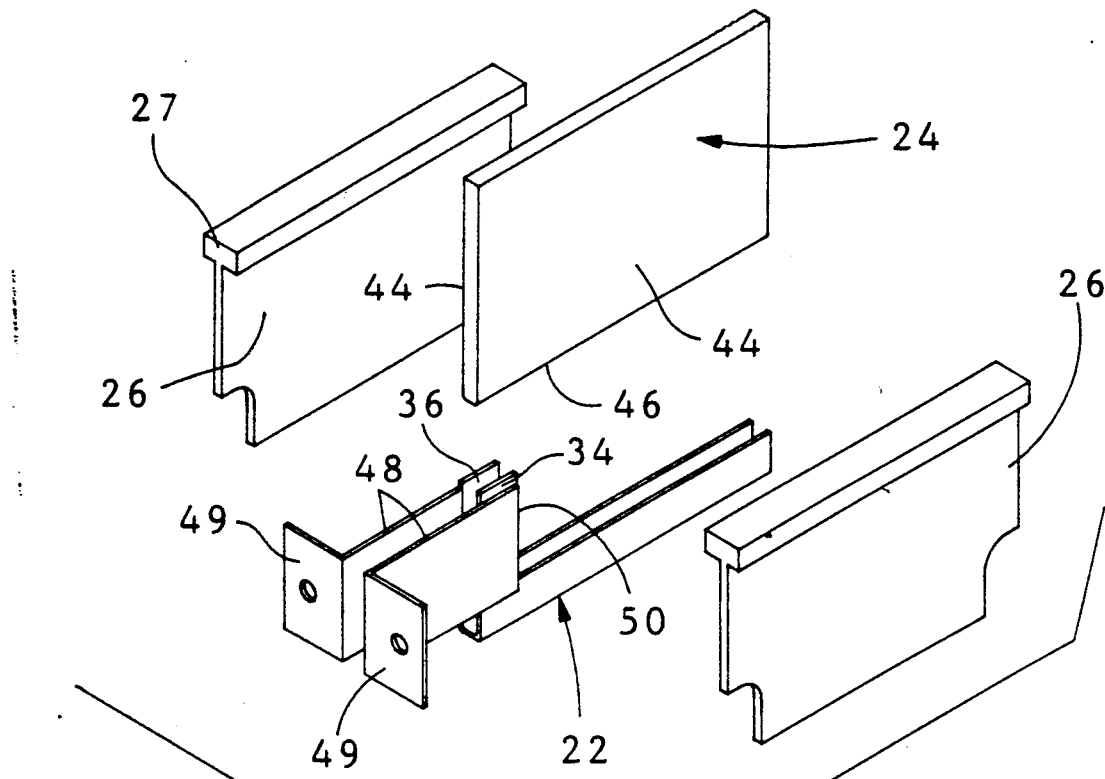
FIG. 3 is a perspective exploded view showing the essential parts of a heater assembly in accordance with the invention.
Figure 4:
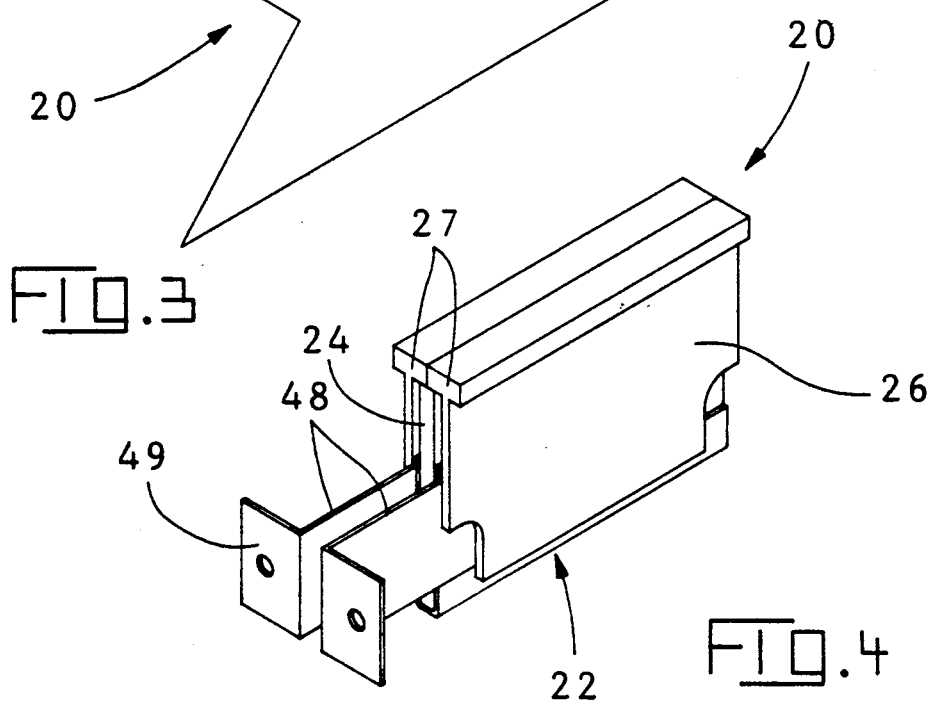
FIG. 4 is a view showing the parts assembled to each other.

The heating unit 22 is formed from the blank 22', by placing a layer of insulating material 42, such as polyimide film (Kapton), against the surface of the wide portion 38 as shown in FIG. 5. Thereafter, the narrow portion is folded along the vertical intermediate fold line 41 so that the ears are adjacent to each other but extend in opposite directions as shown in FIG. 8. The folded heating unit is then placed on the support 24. This support has oppositely facing major parallel surfaces 44 and a lower edge surface 46 which extends normally of the surfaces 44. The folded heating unit is U-ed as shown in FIG. 3 and positioned on the support with the marginal side portions of the U-ed section extending partially over the oppositely facing major surfaces 44. The ears 34, 36 will then extend along these surfaces beyond the marginal side portions The U-ed heating member is then clamped against the surfaces 44 by the clamping members 26 in a manner described below. These clamping members have enlarged upper ends 27 which are received in a jaw assembly FIG. 3 shows a pair of parallel spaced-apart plate-like conductors 48 having laterally extending ears 49 on their ends. These plate-like conductors overlap the laterally extending ears 36, 34 and are clamped against them by the clamping members 26 thereby to achieve electrical connections between the conductors 48 and the terminals 34, 36 of the heating unit. The conductors 48 are carefully dimensioned to achieve an impedance match as will be described below.

A soldering apparatus 52, FIGS. 9–11, which incorporates a heater bar assembly as described above, comprises a base 54, a support column 56, and a laterally extending arm 58 at the upper end of the column. A powered slide assembly 60 is mounted on the end of the arm 58. This slide may be of a commercially available conventional type and need not be described in detail. The slide shown is a TS03 which is available from PHD Inc., Airport and Piper Drive, Fort Wayne, IN 46899. The powered slide assembly 60 comprises a piston cylinder 62, a bearing block 64, and a crosshead 68 The cylinder of the piston cylinder 62 is secured to the bearing block 64 and the piston rod 66 extends through the bearing block and has its ends secured to the cross-head. Guide rods 70 extend from the cross-head through the bearing block.

A jaw assembly 72 is provided on the end of the piston rod for holding the heater unit 20 as best seen in FIG. 11. This jaw assembly comprises a fixed jaw part 74 and a movable jaw part 78, the fixed jaw part being secured to the cross-head by fasteners 76. The movable jaw part 78 is adjustably secured to the fixed jaw part by a fastener 80 and the opposed surfaces of the two jaws have recesses 82 therein for reception of the enlarged upper ends 27 of the clamping plates 26. Suitable controls are provided for lowering the cross-head when a soldering operation is carried out thereby to position the heater bar assembly against the conductors and to hold the conductors against the terminal pads on the substrate as will be described below.

As best seen in FIG. 9, a fixture 84 is provided on the base 54 for holding the substrate and for locating the conductors of the cable against the terminal pads on the substrate. This fixture has a locating plate 86 in which there is provided a recess 88 for a housing (not shown in FIG. 1) which is coupled to the substrate. Locating pins 90 are provided which extend through the holes 19 in the substrate so that it is accurately positioned. The cable is clamped in a cable clamping portion 92 having a support plate 94 and an adjusting knob 96 by means of which the cable can be moved in lateral directions so as to bring the conductors into alignment with the terminal pads. The cable is clamped against plate 94 by a separate clamping plate (not shown). The fixture 84 is mounted on a suitable support which is pivoted as shown at 100 so that it can be swung upwardly thereby to enable the operator conveniently to position the cable on the fixture.

FIG. 12 shows in block diagram form the essential electrical parts of the heating system, the power supply 110, the load, which is the heating unit 22, a matching impedance network 102, a transmission line 112 which extends from the power supply to the matching impedance network, and a transmission line 48 which extends from the network to the heater or load. For reasons explained immediately below, an important feature of the invention is the provision of the matching impedance network 102 immediately adjacent to the heater and the provision of the short, carefully dimensioned and designed conductors 48 which serve as the transmission line between the network and the heater.

The power supply 110 will have an output impedance which is relatively high as compared to the impedance of the heater. For example, the power supply impedance can be assumed to be 50 ohms and the impedance of the heater 3 ohms. In order to realize acceptable operation of the apparatus, the impedance of heater should be equal to the impedance of the power supply; however, the heater must be designed with thermal and size requirements foremost and the heater cannot be designed to have the same impedance as the power supply. The matching impedance network is therefore required to match the impedance of the load to the impedance of the power supply. The parallel plate-like conductors function as a network transmission line and 48 are, in effect, a part of the matching impedance network by virtue of the fact that they contribute to the overall impedance characteristics of the network. The length of these conductors is preferably very short and they must be designed carefully with their impedance characteristics in mind. Also, the spacing between these conductors must be carefully controlled and must not change during operation of the apparatus so that their impedance characteristics will not vary.

The problems discussed above are solved by mounting the network housing 102 on the jaw assembly immediately adjacent to the heater and providing the short conductors 48 which are rigid so that they remain in the same relationship to each other when the heater is moved into and out of engagement with a workpiece on the fixture. As shown in FIGS. 9 and 10, the network housing is secured to the crosshead 68 by a bracket and fastener 106 and the ears 49 on the conductors 48 are connected by fasteners to L-shaped conductors 108 which are then in turn connected to the terminals of the rematching impedance network. All of the parts are in a fixed relationship to each other and do not move relative to each other when the apparatus is in use so that the impedance characteristics remain constant.

FIGS. 13 and 14 illustrate the flow of current in a Curie-type heater at temperatures below the Curie temperature and at, or above, the Curie temperature. At temperatures below the Curie temperature, the magnetic permeability of the magnetic layer 28 is very high and, because of the skin effect, the current will flow primarily in the magnetic layer as indicated by the large arrows in FIG. 13. The electrical resistance in the magnetic layer is high and the $I^2R$ heating effect will be substantial thereby raising the temperature of the heater. When the Curie temperature is reached, the magnetic permeability abruptly drops and the skin depth (the zone in which the current flows) is increased. Much of the current thus flows in the copper layer 30 as indicated by the large arrows in FIG. 14. The resistance encountered by the current is reduced as a result of the fact that it is flowing in the copper layer and the $I^2R$ heating effect is greatly reduced. If the temperature of the heater subsequently drops below the Curie temperature for any reason (for example by the extraction of heat from the heater during a soldering operation as described below) the current pattern of FIG. 13 will be restored and more heat will be produced. The heater is thus self-regulating.

FIG. 15 and 16 illustrate the manner in which heat is supplied to the solder sites in the practice of the invention. The solder is supplied in the form of a narrow ribbon 114 which is spread across the substrate and over the terminal pads 12. The conductors 6 are then placed on the pads 12 and the heater is positioned against the conductors as shown in FIG. 15. This view shows the pattern of current flow at the instant the heater is energized. As the heater approaches the Curie temperature, the conductors extract heat from the heater and the conductors, the pads, and the solder are heated to the Curie temperature. The solder is drawn from the surface 13 and formed into filets 116 as it fuses. After the solder is completely melted and formed into the filets, thermal equilibrium is established at the Curie temperature. The current pattern of FIG. 16 is then established with most of the current flowing in the copper layer 30 so that the $I^2R$ heating effect is reduced. Overheating, with possible damage to the substrate, is thus avoided by the self-regulation of the heater.

FIG. 16 illustrates the condition which can exist during final portion of the soldering process. It is assumed that the conductors 6a on the right in FIG. 16 has not been completely soldered and that the other conductors have been soldered. Conductor 6a is therefore extracting heat from the heater and the heater in the vicinity of conductor 6a has not yet reached the Curie temperature. The current is thus concentrated in the magnetic layer in the vicinity of conductor 6a and the $I^2R$ heating is relatively high in this localized zone.

FIG. 16 also shows the manner in which improved physical contact between the heater and the conductors is achieved. The surface of the heater is somewhat resilient due to the presence of the insulating layer 42. When the heater is pressed against the conductors, the surface of the heater is flexed and conforms to the surfaces of the conductors. The interfacial surface area which is available for heat transfer from the heater to the conductors is thus greatly increased resulting in more rapid heat transfer with a resulting reduction in the time required to complete the soldering process.

We claim:

1. A heater bar assembly for delivering heat to a predetermined zone, the heater bar assembly comprising:
    an insulating support member and a bi-metallic self-regulating Curie effect heater, the support member having a supporting edge and two major surfaces extending from the supporting edge,
    the heater having a non-magnetic layer having a relatively high conductivity and a magnetic layer having a relatively low conductivity the heater having opposite ends and having heater terminals at the ends, the heater being folded, end to end, on a fold line which is substantially mid-way between the ends so that the heater terminals are adjacent to each other, the folded heater comprising two substantially parallel aligned sections which extend from the heater terminals to the fold, the two sections having their magnetic surfaces opposed to, and proximate to, each other and having their non-magnetic surfaces remote from each other and facing in opposite directions, the heater having insulating material between the opposed magnetic surfaces,
    the heater being secured to the support member with the supporting edge against the non-magnetic material of one of the folded sections, with the supporting edge extending from the terminals to the fold, and with the non-magnetic material of the other folded section facing away from the support member whereby,
upon passage of a high frequency current through the heater, the magnetic material will be heated to, and maintained at, its Curie temperature by skin effect phenomena.

2. A heater bar assembly as set forth in claim 1 characterized in that the heater is U-shaped and has marginal side portions which extend from the heater terminals to the fold, the marginal side portions extending from the supporting edge partially over the major surfaces of the support member.

3. A heater bar assembly as set forth in claim 2 characterized in that the heater is secured to the support member by clamps which clamp the marginal side portions of the two aligned sections against the major surfaces of the support member.

4. A heater bar assembly as set forth in claim 1 characterized in that the insulating support is a plate-like member, the two major surfaces being parallel and facing in opposite directions, the supporting edge being an edge surface which extends between, and normally of, the major surfaces.

5. A heater bar assembly as set forth in claim 1 characterized in that the non-magnetic material is copper and the magnetic material is an iron-nickel alloy.

6. A heater bar assembly as set forth in claim 1 characterized in that the non-magnetic material of the other folded section, which faces away from the support, has a coating thereon which is not wettable by solder.

7. A heater bar assembly as set forth in claim 6 characterized in that the coating is a stainless steel.

8. A heater bar assembly as set forth in claim 1 in combination with a high frequency power supply, a matching impedance network, a power supply transmission line extending from the power supply to the network, and a network transmission line extending from the network to the heater, the power supply and the heater each having a predetermined impedance, the matching impedance network serving to match the impedance of the heater to the impedance of the power supply.

9. A heater bar assembly as set forth in claim 8 characterized in that the matching impedance network is adjacent to, and part of, the heater bar assembly, the heater terminals comprise heater ears which are integral with, which are part of, and which extend from, the laminate, the network transmission line comprising flat planar network ears, which extend from the matching impedance network, the network ears being against, and in electrical contact with, the heater ears, the network ears and the heater ears being in parallel spaced-apart planes.

10. A heater bar assembly as set forth in claim 9 characterized in that the heater ears and the network ears have overlapping portions which are clamped against each other by clamping means.

11. A heater bar assembly as set forth in claim 10 characterized in that the overlapping portions of the heater ears and the network ears are against the major surfaces of the support, the clamping means serving to clamp the overlapping portions against each other and against the major surfaces.

12. A heater bar assembly as set forth in claim 11 characterized in that the heater has marginal side portions which extend from the heater ears to the fold, the marginal side portions extending over the major surfaces of the support member from the supporting edge and being clamped against the major surfaces by the clamping means.

13. A heater bar assembly as set forth in claim 1 characterized in that the heater is resiliently deformable towards the supporting edge whereby, upon placement of the heater against surface portions of the predetermined zone, the heater is compliant and will conform the surface portions of the zone.

14. A heater bar assembly as set forth in claim 1 characterized in that the heater bar assembly is intended for soldering a first array of conductors, such as spaced-apart conductors in a cable, to a second array of conductors, such as spaced-apart terminal pads on a substrate, the heater being resiliently deformable towards the supporting edge whereby, upon placement of the heater against the first and second conductors, the heater will be compliant to the conductors and will hold the conductors against movement during soldering.

15. A soldering apparatus for soldering an array of first coplanar conductors, such as the conductors in a flat cable, to an array of second conductors, such as spaced-apart terminal pads on a substrate, the apparatus comprising a work holder for holding the first and second conductors adjacent to each other and in registry, a heater bar assembly which is mounted on a fixture means and is normally spaced from the work holder, the fixture means having a heater bar assembly moving means for moving the heater bar assembly to the work holder thereby to bring the heater bar assembly into engagement with the conductors on the work holder, the apparatus being characterized in that:

the heater bar assembly comprises an insulating support member and a bi-metallic self-regulating Curie effect heater, the support member having a supporting edge and two major surfaces extending from the supporting edge, the heater having a non-magnetic layer having a relatively high conductivity and a magnetic layer having a relatively low conductivity, the heater having opposite ends and having heater terminals at the ends, the heater being folded, end to end, on a fold line which is substantially mid-way between the ends so that the heater terminals are adjacent to each other, the folded heater comprising two substantially parallel aligned sections which extend from the heater terminals to the fold, the two sections having their non-magnetic surfaces opposed to, and proximate to, each other and having their magnetic surfaces remote from each other and facing in opposite directions, the heater having insulating material between the opposed non-magnetic surfaces, the heater being secured to the support member with the supporting edge against the magnetic material of one of the folded sections, with the supporting edge extending from the terminals to the fold, and with the magnetic material of the other folded section facing away from the support member whereby, upon placement of the first and second conductors in the work holder, moving the heater bar assembly towards the work holder and positioning the supporting edge adjacent to the conductors so that the magnetic material of the other folded section is against the conductors, and passing a high frequency current through the heater, the first and second conductors will be soldered to each other.

16. A soldering apparatus as set forth in claim 15 characterized in that the apparatus further comprises a high frequency power supply, a matching impedance network, a power supply transmission line extending from the power supply to the network, and a network transmission line extending from the network to the heater, the power supply and the heater each having a predetermined impedance, the matching impedance network serving to match the impedance of the heater to the impedance of the power supply.

17. A soldering apparatus as set forth in claim 16 characterized in that the matching impedance network is adjacent to, and mounted on, the heater bar assembly, the heater terminals comprise heater ears which are integral with, which are part of, and which extend from, the laminate, the network transmission line comprising network ears which extend from the matching impedance network, the network ears being against, and in electrical with, the heater ears, the network ears and the heater ears being in parallel spaced-apart planes.

18. A soldering apparatus for soldering an array of first coplanar conductors, such as the conductors in a flat cable, to an array of second conductors, such as spaced-apart terminal pads on a substrate, the apparatus comprising a work holder for holding the first and second conductors adjacent to each other and in registry, a heater bar assembly which is mounted on a fixture means and is normally spaced from the work holder, the fixture means having a heater bar assembly moving means for moving the heater bar assembly to the work holder thereby to bring the heater bar assembly into engagement with the conductors on the work holder, the apparatus being characterized in that:

the heater bar assembly comprises a self-regulating Curie effect heater and a heater carrier on which the heater is mounted, the heater carrier being secured to the moving means, a high frequency power supply and a matching impedance network are provided for energizing the heater, a power supply transmission line extends from the power supply to the matching impedance network and a network transmission line extends from the matching impedance network to the heater, the matching impedance network and the network transmission line being mounted on, and movable with, the heater carrier, the network transmission line comprising rigid conductors whereby, upon placement of the first and second conductors in the work holder, moving the heater bar assembly towards the work holder and positioning the heater bar assembly against the conductors, and passing a high frequency current through the heater, the first and second conductors will be soldered to each other.

19. A soldered apparatus as set forth in claim 18 characterized in that the network transmission line comprises spaced-apart ears extending from the matching impedance network to the heater.

* * * * *